United States Patent [19]

Ipri et al.

[11] Patent Number: 4,996,575
[45] Date of Patent: Feb. 26, 1991

[54] LOW LEAKAGE SILICON-ON-INSULATOR CMOS STRUCTURE AND METHOD OF MAKING SAME

[75] Inventors: Alfred C. Ipri, Princeton; Louis S. Napoli, Hamilton Square, both of N.J.

[73] Assignee: David Sarnoff Research Center, Inc., Princeton, N.J.

[21] Appl. No.: 400,204

[22] Filed: Aug. 29, 1989

[51] Int. Cl.$^5$ .................... H01L 27/01; H01L 27/13; H01L 29/78; H01L 27/12
[52] U.S. Cl. ........................................ 357/23.7; 357/4; 357/53; 357/23.14; 357/42
[58] Field of Search .............. 357/23.7, 4, 42, 53

[56] References Cited

U.S. PATENT DOCUMENTS

| | | | |
|---|---|---|---|
| 4,065,781 | 12/1977 | Gutknecht | 357/23 |
| 4,091,527 | 5/1978 | Goodman et al. | 29/571 |
| 4,309,715 | 1/1982 | MacPherson et al. | 357/37 |
| 4,313,809 | 2/1982 | Benyon, Jr. et al. | 204/192 |
| 4,507,846 | 4/1985 | Ohno | 29/571 |
| 4,700,454 | 10/1987 | Baerg et al. | 357/23.7 |
| 4,766,482 | 8/1988 | Smeltzer et al. | 357/23.7 |
| 4,778,775 | 10/1988 | Tzeng | 357/23.7 |
| 4,907,053 | 3/1990 | Ohmi | 357/23.7 |

FOREIGN PATENT DOCUMENTS

| | | | |
|---|---|---|---|
| 61-232676 | 10/1986 | Japan | 357/23.7 |
| 61-232676 | 10/1986 | Japan . | |
| 1120868 | 5/1989 | Japan | 357/23.7 |

Primary Examiner—Andrew J. James
Assistant Examiner—Cynthia S. Deal
Attorney, Agent, or Firm—William J. Burke

[57] ABSTRACT

A CMOS device is provided with a field shield region below one of the P and N channel MOS transistors, whereby the field shield region is formed to have the opposite conductivity of both the one MOS transistor it underlies, and of the substrate, thereby permitting the field shield region to be biased to a potential for turning off any anomalous back channel leakage current in the one MOS transistor, and also permitting the substrate to be biased to an opposite polarity for turning off such leakage current in the other MOS transistor.

7 Claims, 4 Drawing Sheets

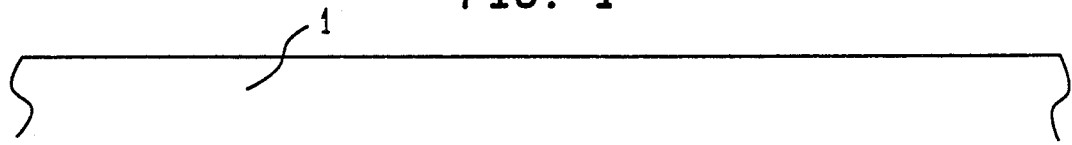
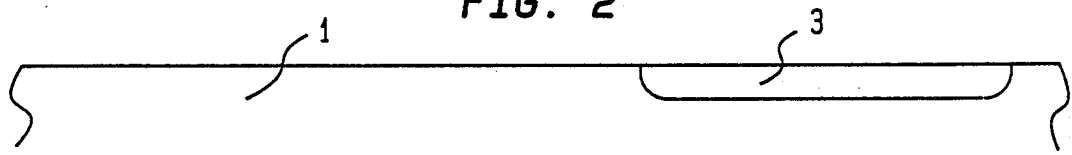
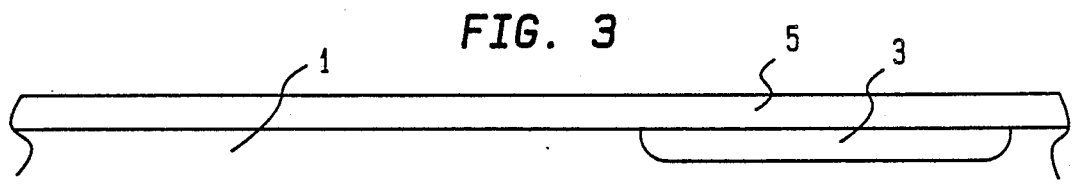
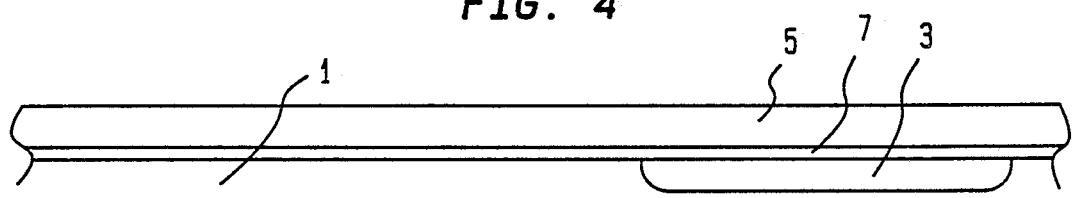
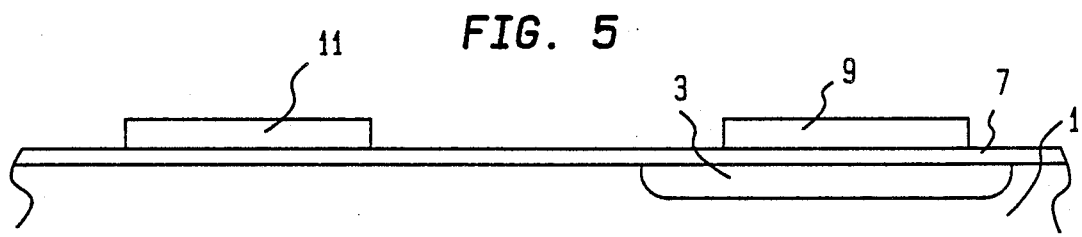
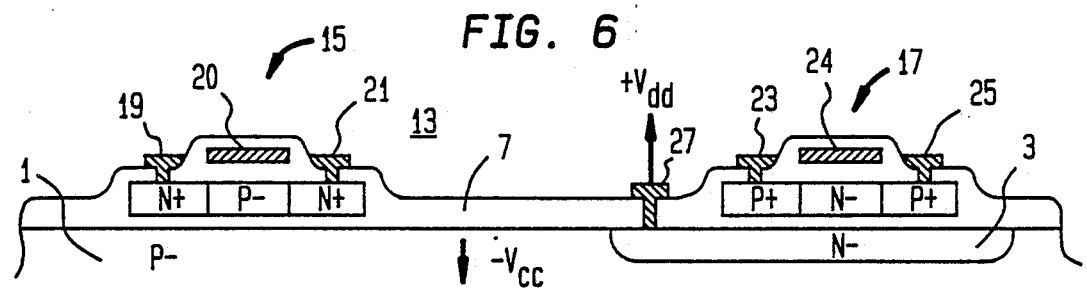

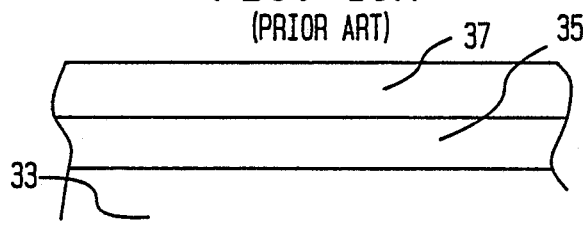
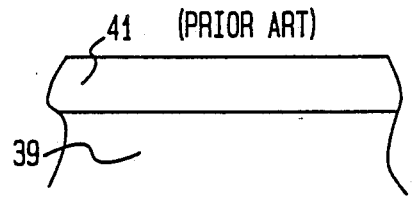
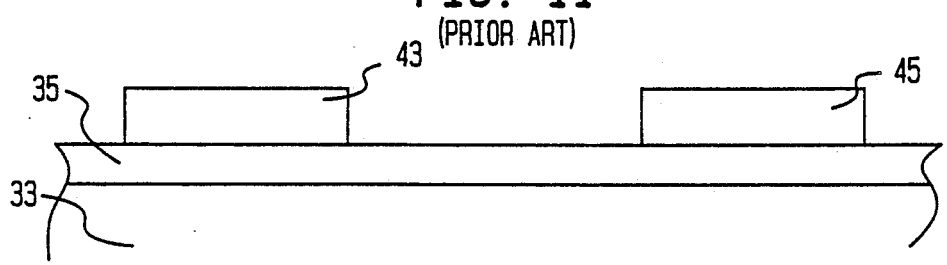
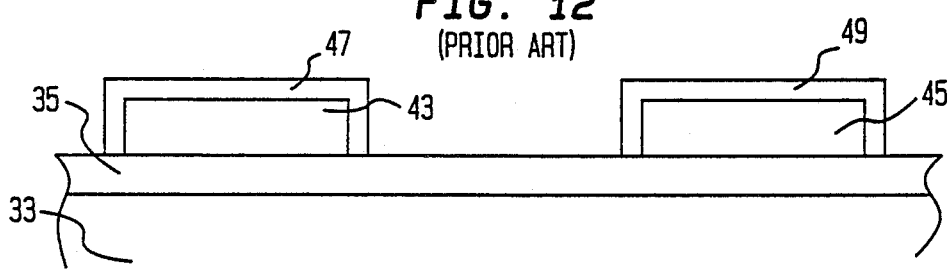
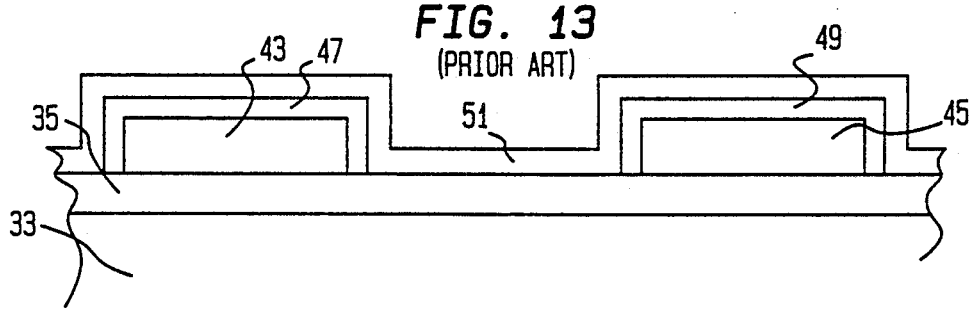
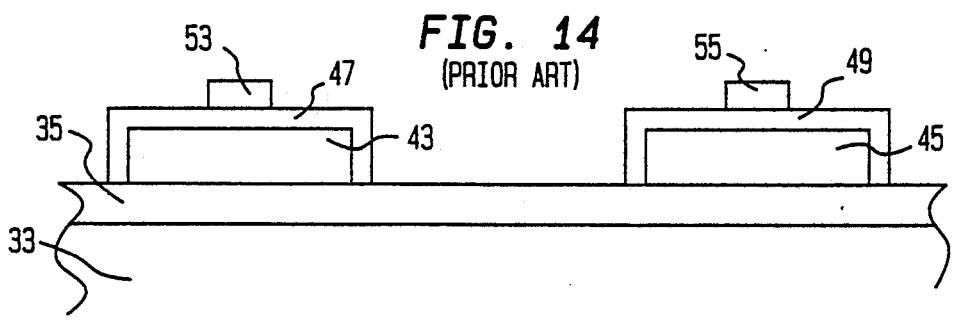

LOW LEAKAGE SILICON-ON-INSULATOR CMOS STRUCTURE AND METHOD OF MAKING SAME

The United States Government has rights in this invention under Contract No. F19628-86-C-0086 with the United States Air Force.

FIELD OF THE INVENTION

The field of the present invention relates generally to CMOS devices, and, more particularly, to low leakage CMOS devices.

BACKGROUND OF THE INVENTION

Complementary metal oxide semiconductor (CMOS) devices comprising interconnected P-channel and N-channel metal oxide semiconductor (MOS) transistors are commonly used in the semiconductor art. In typical thin film silicon-on-insulator (SOI) MOS devices, an anomalous leakage path is formed along the bottom of the transistor(s) of the device, from source to drain. The leakage path or paths may be caused by charge buildup in the insulator under the transistor(s) after a burst of ionizing radiation, or may be present in the insulator(s) during the formation of the device(s). A substrate bias can be used to turn off the leakage path in one transistor type (N or P). However, in CMOS/SOI circuits, the substrate bias that turns off one device causes the other device of opposite conductivity to turn on.

Current leakage or the reduction of current leakage paths is typically an on-going concern for designers of various semiconductor devices. For example, in Japanese Patent No. 61-232676(A), issued on Oct. 16, 1986, and entitled "Semiconductor Device", a CMOS device is disclosed. The device consists of an N- silicon substrate 1, including thereon juxtaposed N and P-channel devices. A PN junction is formed longitudinally in the semiconductor substrate below an insulating layer 2 of $SIO_2$, with the P-channel and N-channel devices being located on top of the insulating layer. The PN junction is formed from a P+ region 11 directly under the central N region 3'C of the PMOS device 3' in the N-substrate 11 below the dielectric layer 2. It is indicated that the PN junction prevents a back channel from being formed "in a device of an SOI structure." It is further indicated that "in this structure, when a positive surge voltage is applied to the substrate 1, a depletion layer is extended, and it is absorbed."

The present inventors believe that the device illustrated in the subject Japanese Patent, uses the P+ region 11 in an AC-like mode, wherein during transient or pulse-like conditions, when a positive pulse or transient surge of voltage is applied to the substrate 1, the P+ region 11 acts in some manner to prevent leakage current from flowing, but the mechanism for preventing such leakage current is unclear. Also, it appears that the P+region 11 must be separated from the source region 3'S and drain region 3'D to prevent capacitive coupling between these regions and the P+ region 11. It is believed that such coupling would disturb the operation of the CMOS device under typical pulse conditions. For proper operation, the oxide capacitance of layer 2 must be substantially larger than the PN junction depletion capacitance between layers 1 and 11.

Gutknecht 4,065,781 discloses an insulated gate thin film transistor including a first or channel semiconductor layer, and a second semiconductor layer contacting the first layer, and also the source electrode of the transistor. This contact is made at least between the source and drain electrodes of the first semiconductor layer. The second semiconductor layer is opposite in conductivity type to the first or channel semiconductor layer, and forms a PN heterojunction with the latter.

Goodman et al. 4,091,527 teaches a method of annealing a silicon substrate in a reducing atmosphere, for preoxidizing the silicon, in order to reduce the leakage current of an N channel transistor to be formed on the substrate subsequent to the annealing process.

MacPherson et al. 4,309,715 teaches the use of a shield region in a solid-state structure for a high voltage switch. The shield region is biased to decrease the turn-on time of the switch.

Benyon et al. 4,313,809 teaches the step of subjecting a completed SOS device to a sputtering operation for depositing a metalized layer on the device, which layer is subsequently removed prior to scribing and dicing. In this manner edge current leakage is reduced.

Ohno 4,507,846 discloses a method for producing silicon-on-sapphire (SOS) semiconductors for providing a CMOS device or devices. A portion of the semiconductor layer between the gate electrodes of the N channel and P-channel devices is removed, whereafter N type and P type impurities are doped into the N-channel and P-channel transistors, respectively, using the gate electrodes as a mask, in order to reduce leakage current.

SUMMARY OF THE INVENTION

With the problems of the prior art in mind, the present inventors recognized that it would be desirable in a CMOS device to provide a means for independently biasing the regions under the N-channel and P-channel MOS devices of the CMOS device, in order to compensate for the charge in the insulator thereof, for eliminating anomalous leakage paths. To provide such biasing, the present invention includes a field shield region wholly underlying one of the MOS transistors of the CMOS device, with the field shield region having an opposite conductivity to that of the source and drain electrodes of the MOS transistor it is underlying, and means for applying a DC bias to the field shield region for preventing leakage current from flowing in the overlying MOS transistor, while at the same time permitting a bias voltage of opposite polarity to be applied to the substrate for preventing the flow of leakage current in the other MOS transistor of the CMOS device.

BRIEF DESCRIPTION OF THE DRAWING

Various embodiments of the present invention will be described below with reference to the figures of the drawing, in which like items are identified by the same reference number, and in which:

FIGS. 1 through 6 illustrate a sequence of process steps for one embodiment of the invention.

FIGS. 10A, 10B, and 11 through 17 illustrate a sequence of process steps known in the prior art for fabricating a CMOS device.

DETAILED DESCRIPTION OF THE PREFERRED EMBODIMENTS OF THE INVENTION

Figure 7:
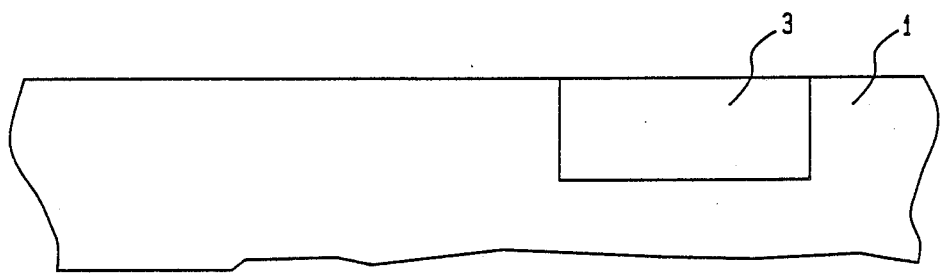
FIGS. 7 and 8 illustrate a sequence of process steps for another embodiment of the invention.

Various preferred embodiments of the present invention are illustrated for incorporation with a CMOS device fabricated, for example, in a thin film silicon-on-insulator (SOI) structure. With reference to FIGS. 1 through 6, a first embodiment of the invention includes the process steps shown. The first step is that of providing a lightly doped P- silicon substrate 1 having an acceptor concentration ranging from (1.0 to $10.0 \times 10^{15}/cm^3$), as shown in FIG. 1. In the next step, as shown in FIG. 2, an N- field shield region 3 is formed in substrate 1 with a concentration of donor atoms Nd ranging from ($1 \times 10^{16} - 1 \times 10^{18}/cm^3$), to a depth ranging between about 0.1 micrometers($\mu$m) and 1.0 $\mu$m. Typically, either standard diffusions or ion implantation may be used in forming the N-field shield region 3 in the P- silicon substrate 1, for example. As will be discussed below, the N- field shield region 3 provides a field shield region for the CMOS device.

After formation of the N- field shield region 3, a lightly boron doped epitaxial silicon layer 5 is deposited to a thickness of between about 1,000Å and 5,000Å, as shown in FIG. 3. The epitaxial layer 5 deposited onto the silicon substrate 1 and over the N- region 3 has a acceptor concentration ranging between about 1.0 and $10.0 \times 10^{15}/cm^3$, for example, but can also be of opposite conductivity type.

The next step, as shown in FIG. 4, provides for the implantation of oxygen into the substrate, using SIMOX oxide in this example, to a dose of 1.0 to $2.0 \times 10^{18}/cm^2$, at an energy between about 100 and 200 keV. This implantation in substrate 1 forms a silicon dioxide ($SiO_2$) sublayer 7 under the epitaxial layer 5, and above the original substrate 1 and N-field shield region 3.

The next step, as shown in FIG. 5, in this example includes the formation of a lightly doped N- island 9 over the N- field shield region 3, and a second lightly doped P- island 11 over another area of the substrate, each formed from the epitaxial layer 5. The N- island 9 is formed to lie wholly within the vertical projection of the N- field shield region 3 through the dielectric layer of silicon dioxide 7.

The next step is to form an N-channel MOS transistor in the P- island 11, and a PMOS transistor in the N- island 9, using standard processing techniques. One of these techniques is discussed below. FIG. 6 shows the resulting CMOS device 13, which device includes an NMOS transistor 15, and a PMOS transistor 17. Note that in the formation of the transistors 15 and 17, appropriate metalization is formed on the substrate 1 for providing the drain electrode 19, and source electrode 21 for the NMOS transistor 15, and the source electrode 23, and drain electrode 25 for the PMOS transistor 17. Conventional techniques are used to provide metalization (not shown) for forming gate electrodes to electrically contact polysilicon gates 20 and 24 of transistors 15 and 17, respectively, in this example. Alternatively, gates 20 and 24 can be metal gates, such as aluminum, for example. Also, metalization is formed on the substrate for providing a bias voltage terminal 27 for biasing the N- region 3 with a positive DC bias voltage +Vdd, in this example. Metalization is also formed on the substrate 1 for receiving another bias voltage of negative polarity, in this example, —Vcc for biasing the substrate 1.

In operation of the CMOS device 13, the +Vdd bias voltage applied to the N- field shield region 3 substantially eliminates anomalous back channel leakage current in the P-channel MOS transistor 17 by forming a reverse biased diode between the N- doped field shield region 3 and the P+ channel of transistor 17. Similarly, by biasing the substrate 1 to a negative DC potential —Vcc, anomalous back channel leakage current in the N-channel MOS transistor 15 is substantially eliminated, via the reverse biased diode between the P- doped substrate and the N+ channel of transistor 15. Also, in the present invention, leakage current in transistors 15 and 17 is substantially eliminated, while avoiding the problems in the prior art with actually turning on transistor 17 because of the negative bias voltage applied to substrate 1.

Figure 8:
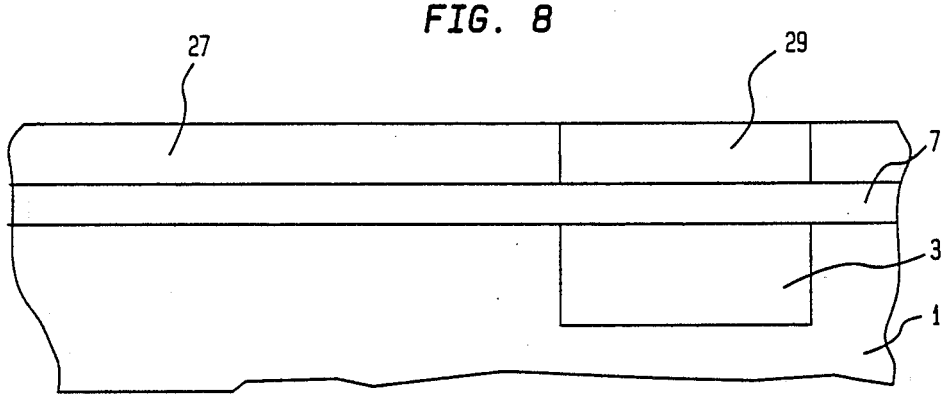

As an alternative to process steps shown in FIGS. 3 and 4, the process steps of FIGS. 7 and 8 can be utilized. Assume that the process step of FIG. 2 has been completed, for forming an N- field shield region 3 in the P- silicon substrate 1. Next, as shown in FIG. 7, oxygen implantation is utilized to form the dielectric layer 7 of silicon dioxide, as shown in FIG. 8. Also, as shown in FIG. 8, the uppermost layer of the substrate 1 is then doped using conventional techniques to form a lightly doped P- region 27, and a lightly doped N- region 29. The island 9 is formed from the N- region 29, and the island 11 is formed from the P- region 27, as shown in FIG. 5, using conventional techniques. Next NMOS transistor 15 is formed in island 11, and the PMOS transistor 17 in island 9, as previously described.

Figure 9:
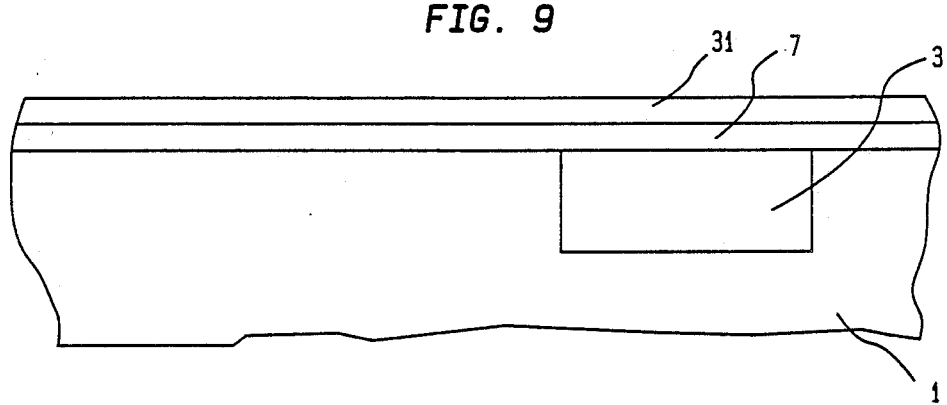
FIG. 9 illustrates a process step for yet another embodiment of the invention.

Another alternative to the process step of FIG. 3 is shown is FIG. 9, wherein conventional techniques are used to form the $SiO_2$ dielectric layer 7 above the original substrate 1 and the N-region 3, and to then deposit a polycrystalline silicon layer 51 over the layer 7 and to recrystallize polysilicon layer 31 to form a single crystal silicon layer 31. The NMOS transistor 15 and the PMOS transistor 17 are then formed in the layer 31, using conventional techniques. Appropriate metalization is formed on the device as previously discussed relative to the process step of FIG. 6, for completing the low leakage CMOS device of the present invention.

For the sake of completeness, FIGS. 10A, 10B, and 11 through 17 illustrate a prior conventional technique for fabricating or making a standard CMOS device, which steps can be utilized in completing the formation of the present low leakage CMOS device after the process step of FIG. 5, for example. Assume as shown in FIG. 10A that the starting material includes a bulk silicon substrate 33 with a central dielectric layer ($SiO_2$, for example) 35 and an upper superficial silicon layer 37. Alternatively, one can start with a sapphire substrate 39 (FIG. 10B) having an upper layer of silicon film 41. Typically, the next step is to form islands 43 and 45 in the superficial layer 37, using photolithography and etching techniques. In this example, island 43 is lightly doped to a P-conductivity and island 45 lightly doped to have an N-conductivity. This step is shown in FIG. 11.

The next step, as shown in FIG. 12, is typically to grow gate oxide on the islands 43 and 45. One typical method is to bathe the substrate in steam at 915° C. to grow a gate dielectric ($SiO_2$) having a thickness of about 300Å making a structure as shown in FIG. 12. Island 43 is as a result covered with a gate oxide layer 47, and island 45 with a gate oxide layer 49.

Figure 15:
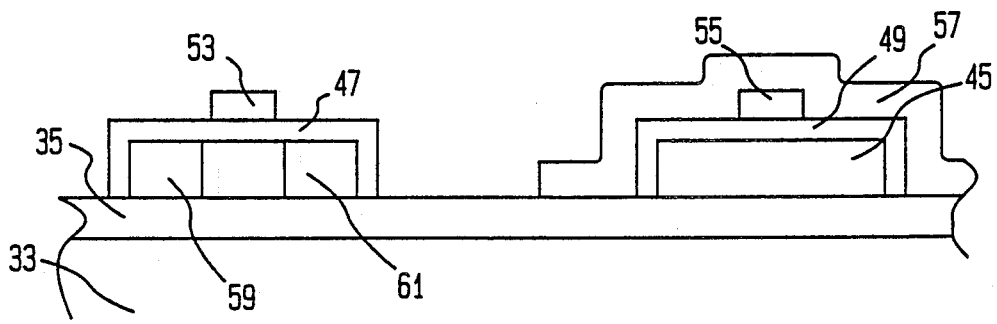
Figure 16:
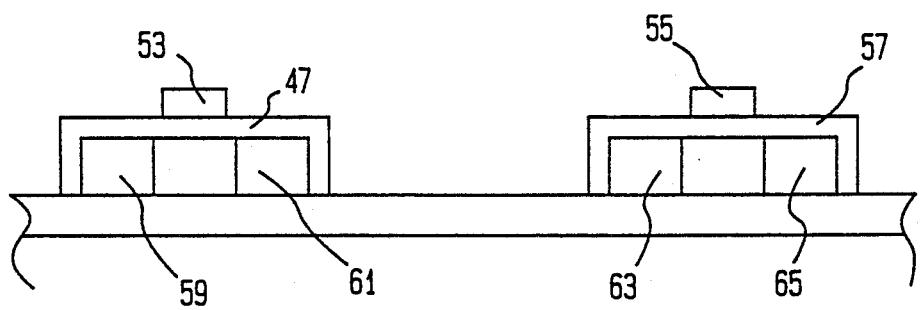
Figure 17:
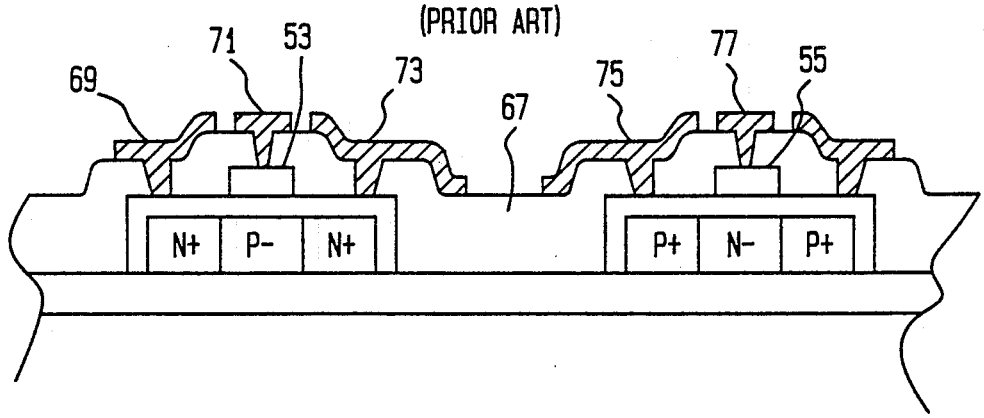

The next step, as shown in FIG. 13 includes the depositing of a polysilicon layer 51 over the substrate, including the polysilicon gates 47 and 49, as shown in FIG. 14. Photolithography and etching are used to form the polysilicon gates 53 and 55, as shown. Next, as shown in FIG. 15, sources and drains for the PMOS and NMOS transistors must be formed. A layer of photoresist material 57 is placed over the device not to be implanted in the next step. And the other device is implanted with phosphorus, for example, to a dose of $1.0 \times 10^{15}/cm^2$ at 100 keV, to form a N+ drain region 59, and a N+ source region 61. Thereafter the transistor just implanted is covered with photoresist material 57, and the photoresist material 57 from the other transistor is removed. (Note that the polysilicon gate 53 provides shielding for the gate region.) Next the other device is implanted with appropriate acceptor material such as boron for forming a P+ source region 63 and a P+ drain region 65, as shown in FIG. 16. Next, as shown in FIG. 17, the top layer is covered with a dielectric insulating layer 67 known as a field oxide. Next, using appropriate photoresist, photolithography, and etching techniques, contact areas are opened. Metal is deposited for providing a drain electrode 69, gate electrode 71, and source electrode 73 for the N-channel MOS transistor. Also, a source electrode 75, gate electrode 77, and drain electrode 25 are provided for the P-channel MOS transistor of the illustrated CMOS device. This standard processing technology can be used for forming the NMOS transistor 15 and PMOS transistor 17 of FIG. 6, after the process step of FIG. 2, whereby the silicon superficial layer 37 would be deposited over the substrate and N- region 3, shown in FIG. 2. Note that with regard to the low leakage CMOS device of FIG. 6, relative to the conventional processing described for the CMOS device in the step of FIG. 17, the dielectric layer 7 must be opened using conventional photolithography and etching techniques for permitting the deposit of metalization for the bias voltage terminal or electrode 27, as previously described. Aluminum is typically used for providing the required metalization for the illustrated CMOS devices. The metal is typically deposited using conventional sputtering techniques.

Although various embodiments of the invention have been illustrated herein, they are not meant to be limiting, and variations to these embodiments may occur to those of skill in the art, which variations are meant to be covered by the spirit and scope of the claims appended hereto. For example, various of the conventional processing steps illustrated herein can be substituted with other conventional processing steps for producing the present low leakage CMOS device. Another example of an alternative embodiment of the invention, is in a CMOS device having a N-lightly doped substrate, with the field shield region necessarily being a P-lightly doped region lying fully under the N channel MOS transistor. In this alternative configuration, the field region would be connected to a negative polarity bias voltage, whereas the substrate would be connected to a positive polarity DC bias voltage. In addition, while the device is described herein as being fabricated in silicon semiconductor material, other semiconductor materials such as compounds of elements from Groups III and V of the Periodic Table may also be used.

What is claimed is:

1. A complimentary metal oxide semiconductor (CMOS) device comprising:
    a substrate of a semiconductor material having a lower portion of a first conductivity type;
    a layer of a dielectric material over the lower portion of said substrate;
    a first island of a semiconductor material of a first conductivity type over a first portion of said dielectric layer, spaced regions of the second conductivity type in said first island forming the source and drain regions of a first MOS transistor of a second conductivity type over a first portion of said dielectric layer;
    a region of a second conductivity type in said substrate immediately below a second portion of said dielectric layer remote from said first portion to provide a field shield;
    a second island of a semiconductor material of said second conductivity type over said second portion of said dielectric layer, spaced region of the first conductivity type in said second island forming the source and drain regions of a second MOS transistor of said first conductivity type over said second portion of said dielectric layer;
    said second island being located wholly within a vertical projection of said field shield region through said second portion of said dielectric layer;
    a first electrode of a conductive material electrically connected to said substrate for receiving a first bias voltage for compensating for any charge in said dielectric layer below said first MOS transistor; and
    a second electrode of a conductive material electrically connected only to said field shield region for receiving a second bias voltage compensating for any charge in said dielectric layer below said second MOS transistor.

2. The CMOS device of claim 1, wherein said substrate consists of silicon material.

3. The CMOS device of claim 1, wherein said first conductivity type is P type, and said second conductivity type is N type.

4. THe CMOS device of claim 3, wherein said substrate has a P- conductivity, and said field shield region has an N- conductivity.

5. The CMOS device of claim 1, wherein said first conductivity type is N type, and said second conductivity type is P type.

6. The CMOS device of claim 5, wherein said substrate has an N- conductivity, and said field shield region has a P-conductivity.

7. The CMOS device of claim 4 including means connected said second electrode to a source of a positive DC voltage and means connecting said first electrode to a source of a negative DC bias voltage for forming a reverse bias PN junction between said field shield region and said substrate.

* * * * *